(12) United States Patent
Bharadwaj

(10) Patent No.: US 11,307,631 B2
(45) Date of Patent: Apr. 19, 2022

(54) DYNAMIC VOLTAGE FREQUENCY SCALING BASED ON ACTIVE MEMORY BARRIERS

(71) Applicant: ADVANCED MICRO DEVICES, INC., Santa Clara, CA (US)

(72) Inventor: Vedula Venkata Srikant Bharadwaj, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 207 days.

(21) Appl. No.: 16/425,414

(22) Filed: May 29, 2019

(65) Prior Publication Data

US 2020/0379543 A1    Dec. 3, 2020

(51) Int. Cl.
*G06F 1/00*      (2006.01)
*G06F 1/3225*    (2019.01)
*G06F 1/3296*    (2019.01)
*G06F 1/324*     (2019.01)

(52) U.S. Cl.
CPC ............ *G06F 1/3225* (2013.01); *G06F 1/324* (2013.01); *G06F 1/3296* (2013.01)

(58) Field of Classification Search
CPC .................................................... G06F 1/3225
See application file for complete search history.

(56) References Cited

U.S. PATENT DOCUMENTS

| | | | | |
|---|---|---|---|---|
| 2005/0195181 A1* | 9/2005 | Khodorkovsky | ..... | G06F 1/3275 345/211 |
| 2012/0198214 A1* | 8/2012 | Gadre | .................... | G06F 9/3004 712/225 |
| 2014/0025892 A1* | 1/2014 | Williams, III | ...... | G06F 12/0862 711/122 |
| 2015/0278053 A1* | 10/2015 | Vahidsafa | ........... | G06F 12/1036 714/6.3 |
| 2016/0041594 A1* | 2/2016 | Hanson | .................... | G06F 1/324 713/320 |
| 2017/0286182 A1* | 10/2017 | Gracia | ..................... | G06F 9/46 |

* cited by examiner

*Primary Examiner* — Mohammed H Rehman

(57) ABSTRACT

A processing unit includes compute units partitioned into one or islands that are provided with operating voltages and clock signals having clock frequencies independent of providing operating voltages or clock signals to other islands of compute units. The processing unit also includes dynamic voltage and frequency scaling (DVFS) hardware configured to compute one or more numbers of active memory barriers in the one or more islands. The DVFS hardware is also configured to modify the operating voltages or clock frequencies provided to the one or more islands in response to a change in numbers of active memory barriers in the one or more islands. In some cases, the operating voltage or clock frequency provided to an island is increased in response to the number of active memory barriers in the island decreasing. The operating voltage or clock frequency provided to the island is decreased in response to the number of active memory barriers in the island increasing.

20 Claims, 6 Drawing Sheets

DYNAMIC VOLTAGE FREQUENCY SCALING BASED ON ACTIVE MEMORY BARRIERS

STATEMENT OF SPONSORED RESEARCH

This invention was made with Government support under PathForward Project with Lawrence Livermore National Security (Prime Contract No. DE-AC52-07NA27344, Subcontract No. B620717) awarded by DOE. The Government has certain rights in this invention.

BACKGROUND

Processing units such as graphics processing units (GPUs) and general-purpose graphics processing units (GPGPUs) are typically organized as a hierarchy that includes multiple compute units that are configured to execute instructions concurrently or in parallel. The compute units include processing elements that are configured according to single-instruction-multiple-data (SIMD) protocols to concurrently execute the same instruction on multiple data sets. The processing elements in the compute unit are therefore referred to as SIMD units. Each SIMD unit includes multiple lanes (e.g., four lanes) to execute individual operations. A hierarchical execution model is implemented in software to match the hierarchy implemented in hardware. The execution model defines a kernel of instructions that are executed by multiple threads of instructions. The threads are also referred to as streams or work items. In some cases, the threads are dependent on each other. Threads are partitioned into workgroups for concurrent execution on corresponding compute units. Threads within a workgroup share data with each other. Each workgroup is associated with a corresponding compute unit for the lifetime of the workgroup. Workgroups are subdivided into wavefronts that execute on the SIMD units in the compute unit. Each thread in a wavefront is executed by a different lane in a SIMD unit.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
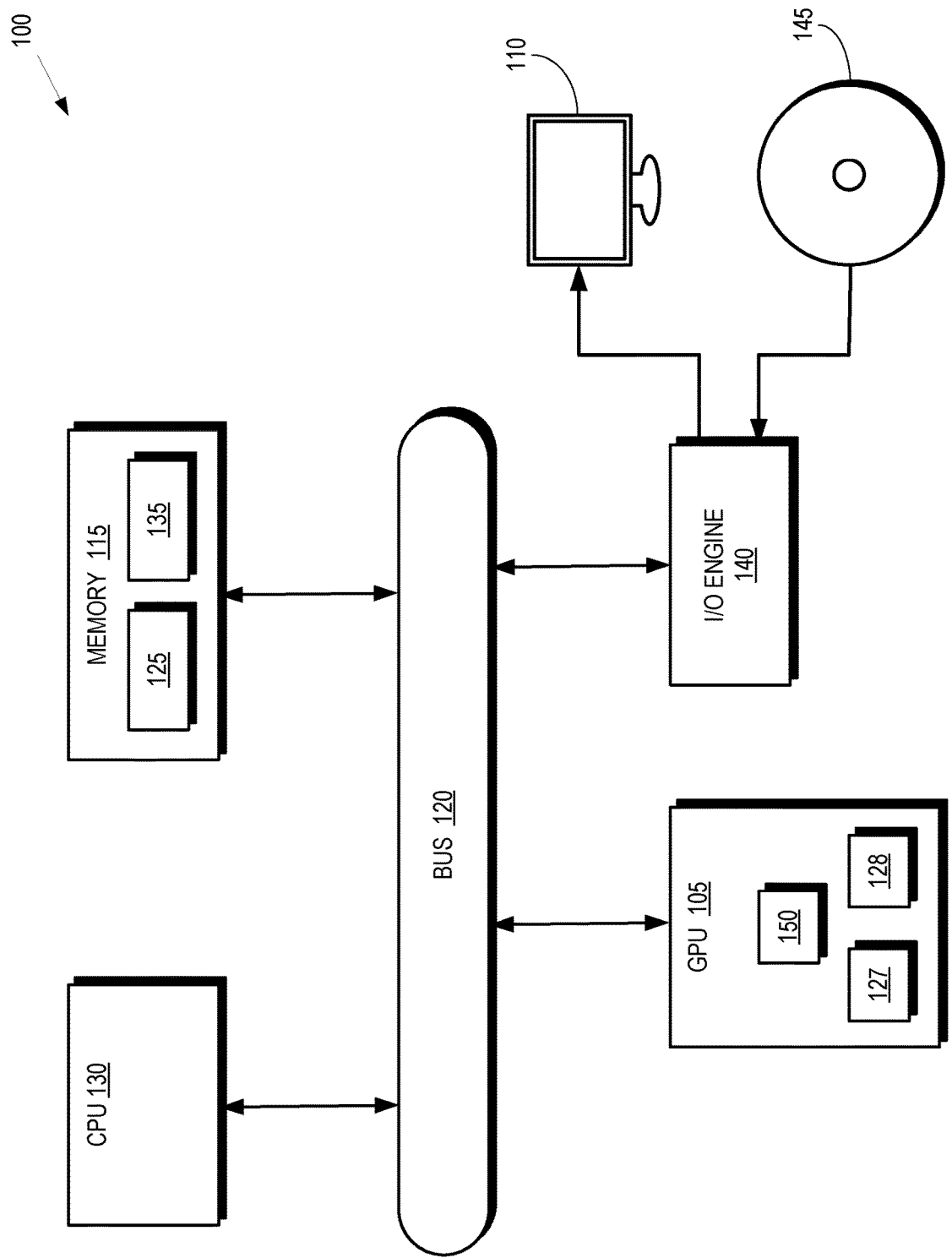
FIG. 1 is a block diagram of a processing system that includes a graphics processing unit (GPU) that implements dynamic voltage and frequency scaling (DVFS) based on a number of active memory barriers in compute unit islands of the GPU according to some embodiments.

Processing units including central processing units (CPUs) and graphics processing units (GPUs) implement dynamic voltage and frequency scaling (DVFS) to manage performance states by setting the voltage or frequency supplied to active components in the processing unit based on measured values of performance counters. In some cases, DVFS software executing on the processing unit decides whether to increase or decrease the voltage or frequency based on software profiling of the code executing on the processing unit or a workload size. However, software-implemented DVFS requires a significant amount of time to gather the information required to decide whether to increase or decrease the voltage or frequency and then act on the decision. For example, implementing DVFS in software introduces delays on the order of microseconds between changes in the state of the processing unit and a change in the voltage or frequency supplied to the processing unit. Moreover, current implementations of DVFS do not account for the different architectures used in a CPU and a GPU and, consequently, DVFS policy implementations designed for a CPU are typically not well-suited for a GPU architecture.

FIGS. 1-6 disclose embodiments of compute units within a processing unit, such as a GPU, wherein the compute units are partitioned into one or more subsets, or islands, which are independently provided with operating voltages and clock frequencies. The number of compute units in an island ranges from one (i.e., each compute unit is a separate island) to the total number of compute units in the processing unit (i.e., the processing unit includes a single island). The processing unit includes DVFS hardware that counts numbers of active memory barriers in each of the islands. As used herein, the term "memory barrier" refers to a time interval in which a wavefront executing on a compute unit is waiting for one or more memory operations (such as load or store operations) to complete. The memory barrier is active (and referred to herein as an "active memory barrier") from the time a wavefront begins waiting to complete memory requests on the compute unit and continues until the memory requests have been satisfied. The memory barrier is activated using explicit activating instructions or in response to implicit wait conditions within hardware that occur because of data dependencies. If a memory barrier is active on a wavefront, the wavefront stops executing instructions until the active memory barrier ends. The DVFS hardware modifies the voltage or frequency supplied to an island in response to changes in the number of active memory barriers within the island. For example, the voltage or frequency is increased in response to the number of active memory barriers within the island decreasing and the voltage or frequency is decreased in response to the number of active memory barriers within the island increasing.

Some embodiments of the DVFS hardware trigger modifications in the voltage or frequency supplied to compute units in an island in response to changes in the number of active memory barriers within the island. For example, the voltage or frequency can be increased in response to a decrease in the number of memory barriers within the island. For another example, the voltage or frequency can be decreased in response to the number of memory barriers increasing from a number within a first range (such as 0-4 active memory barriers) to a number within a second range (such as 5-8 active memory barriers). Some embodiments of the DVFS hardware evaluate and trigger modifications in the voltage or frequency at predetermined time intervals. For example, the DVFS hardware can periodically evaluate the number of active memory barriers at the end of predetermined time intervals. The DVFS hardware modifies the voltage or frequency if the number of active memory barriers at the end of the predetermined time interval is different than the number at the beginning of the predetermined time interval. Some embodiments of the DVFS hardware implement hybrid techniques that combine dynamic and static triggering intervals. For example, the DVFS hardware can modify the voltage or frequency within the island in response to a change in the number of active memory barriers within the island as long as there has not been a change in the voltage or frequency within a predetermined time interval prior to the change in the number of active memory barriers. In some embodiments, the predetermined time interval is set to a minimum time interval that is determined based on a comparison of an overhead required to change the voltage or frequency state within an island and the potential power savings or performance gain produced by the change.

FIG. 1 is a block diagram of a processing system 100 that includes a graphics processing unit (GPU) 105 that implements DVFS based on a number of active memory barriers in compute unit islands of the GPU according to some embodiments. The processing system 100 includes a display 110 and a memory 115. Some embodiments of the memory 115 are implemented as a dynamic random access memory (DRAM). However, the memory 115 can also be implemented using other types of memory including static random access memory (SRAM), nonvolatile RAM, and the like. In the illustrated embodiment, the GPU 105 communicates with the memory 115 over a bus 120 that is implemented as a peripheral component interconnect (PCI) bus, PCI-E bus, or other type of bus. However, some embodiments of the GPU 105 communicate with the memory 115 over a direct connection or via other buses, bridges, switches, routers, and the like. The GPU 105 can execute instructions stored in the memory 115 and the GPU 105 can store information in the memory 115 such as the results of the executed instructions. For example, the memory 115 can store a copy 125 of instructions from a program code that is to be executed by the GPU 105.

The GPU 105 includes multiple compute units that independently execute instructions concurrently or in parallel. The compute units are grouped into islands 127, 128 that each include one or more compute units. Although two islands 127, 128 are shown in FIG. 1, the number of islands in the GPU 105, as well as the number of compute units within each of the islands, is a matter of design choice. Operating voltages and clock signals are independently provided to the compute units in the islands 127, 128. Consequently, DVFS is independently applied to the compute units within the islands 127, 128. For example, an operating voltage or frequency of the clock signal provided to the compute units in the island 127 is modified independently of the operating voltage or frequency of the clock signal provided to the compute units in the island 128, and vice versa. The GPU 105 also includes DVFS hardware 150 that monitors the islands 127, 128 and computes numbers of active memory barriers in the islands 127, 128. The DVFS hardware 150 modifies operating voltages or clock frequencies provided to the islands 127, 128 in response to changes in the number of active memory barriers in the islands 127, 128.

The processing system 100 includes a central processing unit (CPU) 130 for executing instructions. Some embodiments of the CPU 130 include multiple processor cores (not shown in the interest of clarity) that can independently execute instructions concurrently or in parallel. The operating voltages or clock frequencies provided to the multiple processor cores can be modified based on numbers of active memory barriers if the multiple processor cores are grouped into islands as discussed herein with regard to the GPU 105. The CPU 130 is also connected to the bus 120 and therefore communicate with the GPU 105 and the memory 115 via the bus 120. The CPU 130 executes instructions such as program code 135 stored in the memory 115 and the CPU 130 stores information in the memory 115 such as the results of the executed instructions. The CPU 130 is also able to initiate graphics processing by issuing draw calls to the GPU 105. A draw call is a command that is generated by the CPU 130 and transmitted to the GPU 105 to instruct the GPU 105 render an object in a frame (or a portion of an object). The GPU 105 renders the object to produce values of pixels that are provided to the display 110, which uses the pixel values to display an image that represents the rendered object.

An input/output (I/O) engine 140 handles input or output operations associated with the display 110, as well as other elements of the processing system 100 such as keyboards, mice, printers, external disks, and the like. The I/O engine 140 is coupled to the bus 120 so that the I/O engine 140 communicates with the GPU 105, the memory 115, or the CPU 130. In the illustrated embodiment, the I/O engine 140 is configured to read information stored on an external storage medium 145, such as a compact disk (CD), a digital video disc (DVD), and the like. The external storage medium 145 stores information representative of program code used to implement an application such as a video game. The program code on the external storage medium 145 can be written to the memory 115 to form the copy 125 of instructions that are to be executed by the GPU 105 or the CPU 130.

Figure 2:
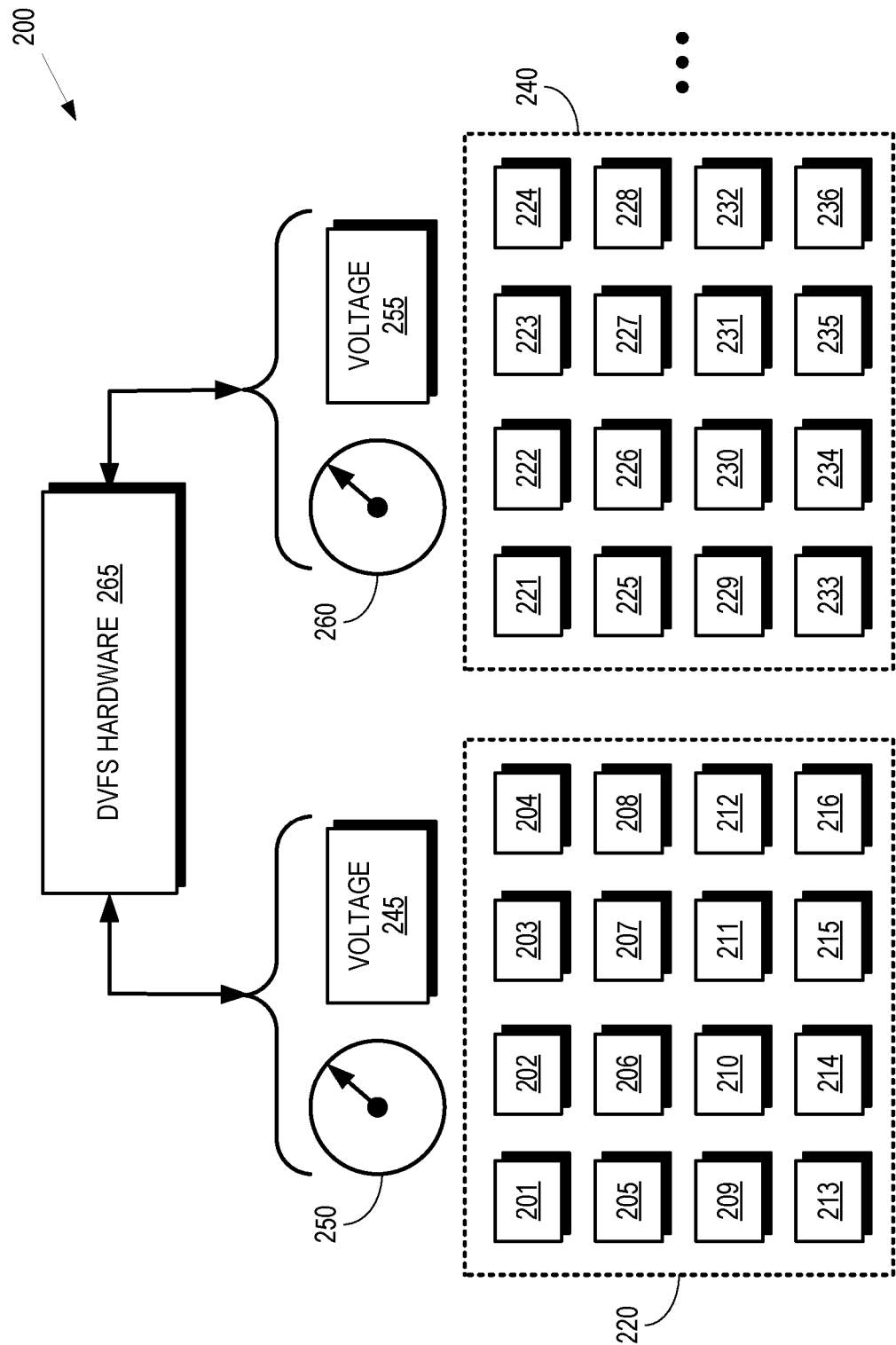
FIG. 2 is a block diagram of a GPU that implements DVFS based on a number of active memory barriers in compute unit islands of the GPU according to some embodiments.

FIG. 2 is a block diagram of a GPU 200 that implements DVFS based on a number of active memory barriers in compute unit islands of the GPU 200 according to some embodiments. The GPU 200 is used to implement some embodiments of the GPU 105 shown in FIG. 1. The GPU 200 includes compute units 201-216 that are grouped into an island 220 and compute units 221-236 that are grouped into an island 240. In the illustrated embodiment, the islands 220, 240 include sixteen compute units 201-216, 221-236, respectively. However, the number of compute units in the islands 220, 240 (as well as the number of islands in the GPU 200) is a matter of design choice and is larger or smaller than the sixteen compute units compute units 201-216, 221-236 in the islands 220, 240, respectively, in some embodiments.

The islands 220, 240 are independently provided with operating voltages and clock signals. A voltage supply 245 provides an operating voltage and a clock 250 provides a clock signal to the compute units 201-216 in the island 220 at a frequency determined by the clock 245. A voltage supply 255 provides an operating voltage and a clock 260 provides a clock signal to the compute units 221-236 in the island 240 at a frequency determined by the clock 260. The operating voltages provided by the voltage supplies 245, 255 and the clock signals provided by the clocks 250, 260 are independently adjustable so that different operating voltages or different clock frequencies can be provided to the islands 220, 240. Although the voltage supplies 245, 255 and the clocks 250, 260 are shown as separate entities in FIG. 2, some embodiments of the GPU 200 implement a single clock and voltage supply that independently provide clock signals and voltages to the islands 220, 240 using separate distribution networks.

The GPU 200 includes a DVFS hardware 265 that monitors the islands 220, 240. Based on the monitoring, the DVFS hardware 265 determines the operating voltages provided by the voltage supplies 245, 255 and the clock frequencies provided by the clocks 250, 260. The DVFS hardware 265 is implemented using one or more processor cores, compute units, field programmable gate arrays (FPGA), application-specific integrated circuits (ASICs), or other circuitry. The DVFS hardware 265 monitors numbers of active memory barriers in the islands 220, 240. Each of the compute units 201-216 in the island 220 and the compute units 221-236 in the island 240 can have an active memory barrier if a wavefront executing on the corresponding compute units 201-216, 221-236 is waiting for a memory access request to complete. Thus, the number of active memory barriers in the islands 220, 240 ranges from 0 to 16.

The DVFS hardware 265 modifies the operating voltages or the clock frequencies provided by the voltage supplies 245, 255 or the clocks 250, 260 in response to a change in the number of active memory barriers in the corresponding islands 220, 240. For example, the DVFS hardware increases the operating voltage provided by the voltage supply 245 or the clock frequency provided by the clock 250 in response to a decrease in the number of active memory barriers in the island 220. For another example, the DVFS hardware decreases the operating voltage provided by the voltage supply 255 or the clock frequency provided by the clock 260 in response to an increase in the number of active memory barriers in the island 240.

Some embodiments of the DVFS hardware 265 modify the operating voltages or the clock frequencies in response to a change in the number of active memory barriers from a first range of numbers of active memory barriers to a second range of numbers of active memory barriers. For example, if the DVFS hardware 265 considers a first range from 0 to 4 active memory barriers and a second range from 5 to 8 active memory barriers, the DVFS hardware 265 increases the operating voltage provided by the voltage supply 245 or the clock frequency supplied by the clock 250 in response to a decrease in the number of active memory barriers from a number in the second range (e.g., 6 active memory barriers) to a number in the first range (e.g., 2 active memory barriers). In some embodiments, different thresholds or numbers of active memory barriers are used to trigger changes in the operating voltage or clock frequency in different islands.

Some embodiments of the DVFS hardware 265 evaluate the numbers of active memory barriers in the islands 220, 240 periodically, e.g., at the end of predetermined time intervals, or in response to other events, or any combination thereof. The DVFS hardware 265 determines whether to modify the operating voltages or clock frequencies based on a comparison of numbers of active memory barriers in the islands 220, 240 at the beginning of the predetermined time interval and at the end of the predetermined time interval. For example, the DVFS hardware modifies the operating voltage or the clock frequency in response to a change in the number of active memory barriers between a beginning and an end of the predetermined time interval. In some embodiments, the predetermined time interval is a minimum time interval determined based on a comparison of an overhead required to modify the operating voltages or clock frequencies (e.g., by reconfiguring the voltage supplies 245, 255 or the clocks 250, 260 based on signals provided by the DVFS hardware 265) and a potential power savings or performance gain produced by the modification. In some embodiments, the criteria for evaluating the number of active memory barriers is different in the different islands 220, 240.

Figure 3:
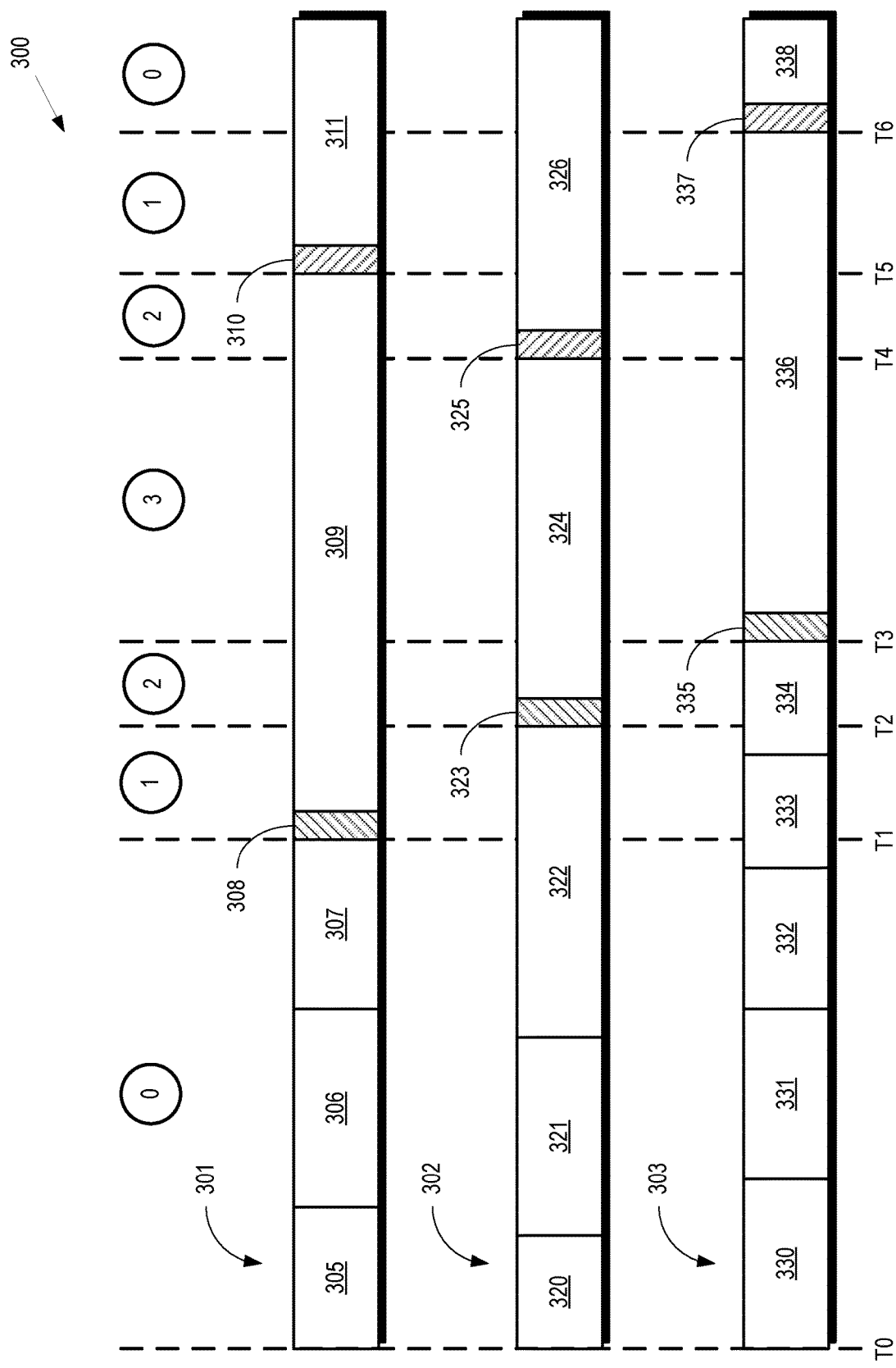
FIG. 3 is a block diagram illustrating active memory barriers in wavefronts executing on compute units of an island according to some embodiments.

FIG. 3 is a block diagram illustrating active memory barriers in wavefronts executing on compute units of an island according to some embodiments. The wavefronts 301, 302, 303 (collectively referred to herein as "the wavefronts 301-303") are executing on some embodiments of the compute units 201-216, 221-236 in the islands 220, 240 shown in FIG. 2. Although three wavefronts 301-303 are shown in FIG. 3, more or fewer wavefronts are executing on the compute units of different islands. Time increases from left to right in FIG. 3.

The first wavefront 301 executes zero or more non-memory operations 305, one or more memory operations 306, zero or more non-memory operations 307, and a memory barrier instruction 308 (at time T1). Execution of the memory barrier instruction 308 results in the beginning of an active memory barrier 309, which ends when the memory barrier instruction is completed or satisfied at block 310 (at time T5). As used herein, the term "satisfied" indicates that completion of the memory operation has been acknowledged. Thus, when the one or more memory operations 306 have been acknowledged to have completed, the active memory barrier is satisfied. The first wavefront 301 then executes zero or more non-memory operations 311.

The second wavefront 302 executes zero or more non-memory operations 320, one or more memory operations 321, zero or more non-memory operations 322, and a memory barrier instruction 323 (at time T2). Execution of the memory barrier instruction 323 triggers the beginning of an active memory barrier 324, which ends when the memory barrier instruction is completed or satisfied at block 325 (at time T4). The second wavefront 302 then executes zero or more non-memory operations 326.

The third wavefront 303 executes zero or more non-memory operations 330, one or more memory operations 331, zero or more non-memory operations 332, and one or more memory operations 333. At time T3, the third wavefront 303 executes a memory barrier instruction 334, which triggers the beginning of an active memory barrier 335. At time T6, the active memory barrier 335 ends in response to the memory barrier instruction completing are being satisfied at block 336. The third wavefront 303 then executes one or more non-memory operations 337.

The wavefronts 301-303 are monitored by DVFS hardware such as some embodiments of the DVFS hardware 150 shown in FIG. 1 and the DVFS hardware 265 shown in FIG. 2. The DVFS hardware counts the number of active memory barriers in the island including the compute units that are executing the wavefronts 301-303. From time T0 to T1, there are no active memory barriers in the DVFS hardware determines that the number of active memory barriers is 0. The DVFS hardware determines that the number of active memory barriers is 1 from the time T1 to T2, the number is 2 from the time T2 to T3, the number is 3 from the time T3 to T4, the number is 2 from the time T4 to T5, the number is 1 from the time T5 to T6, and the number is 0 after the time T6. As discussed herein, the DVFS hardware modifies an operating voltage or a clock frequency provided to the island in response to the changes in the numbers of active memory barriers.

Figure 4:
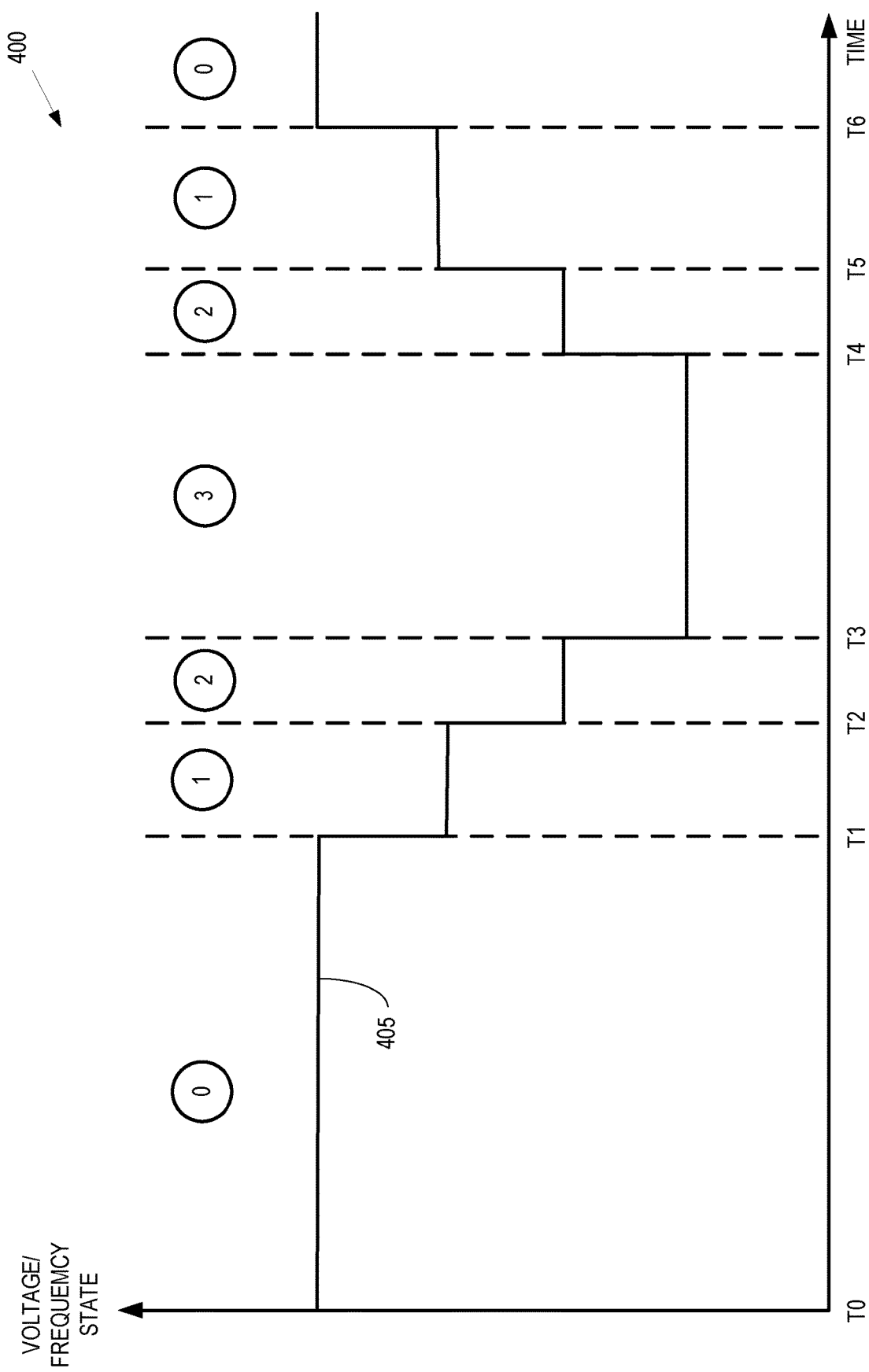
FIG. 4 is a plot of a voltage/frequency state of a compute unit island in a processing unit as a function of time according to some embodiments.

FIG. 4 is a plot 400 of a voltage/frequency state of an island in a processing unit as a function of time according to some embodiments. The times T0, T1, T2, T3, T4, T5, and T6 refer to the corresponding times shown in FIG. 3. Thus, the number of active memory barriers in the island corresponds to the number determined by the DVFS hardware while monitoring the wavefronts 301-303 shown in FIG. 3. In the illustrated embodiment, the voltage/frequency state indicates an operating voltage supplied to the island, a clock frequency supplied to the island, or a combination thereof. Larger values of the voltage/frequency state indicate higher operating voltages, higher clock frequencies, or a combination thereof.

The line 405 indicates the voltage/frequency state of the island as a function of time. In the time interval T0 to T1, the voltage/frequency state of the island is at a first (relatively high) value indicating that the operating voltage, the clock frequency, or a combination thereof are at an initial (relatively high) value. At time T1, the DVFS hardware detects an increase in the number of active memory barriers from 0 to 1 and, in response to detecting the increase, reduces the voltage/frequency state of the island to a second value that is lower than the first value. At time T2, the DVFS hardware detects an increase in the number of active memory barriers from 1 to 2 and, in response to detecting the increase, reduces the voltage/frequency state of the island to a third value that is lower than the second value. At time T3, the DVFS hardware detects an increase in the number of active memory barriers from 2 to 3 and, in response to detecting the increase, reduces the voltage/frequency state of the island to a fourth value that is lower than the third value.

At time T4, the DVFS hardware detects a decrease in the number of active memory barriers from 3 to 2 and, in response to detecting the decrease, increases the voltage/frequency state of the island to the third value. At time T5, the DVFS hardware detects a decrease in the number of active memory barriers from 2 to 1 and, in response to detecting the decrease, increases the voltage/frequency state of the island to the second value. At time T6, the DVFS hardware detects a decrease in the number of active memory barriers from 1 to 0 and, in response to detecting the decrease, increases the voltage/frequency state of the island to the first value. In some embodiments, changes in the voltage/frequency state are different for decreases in the number of active memory barriers and increases in the number of active memory barriers, e.g., in order to introduce a hysteresis.

Figure 5:
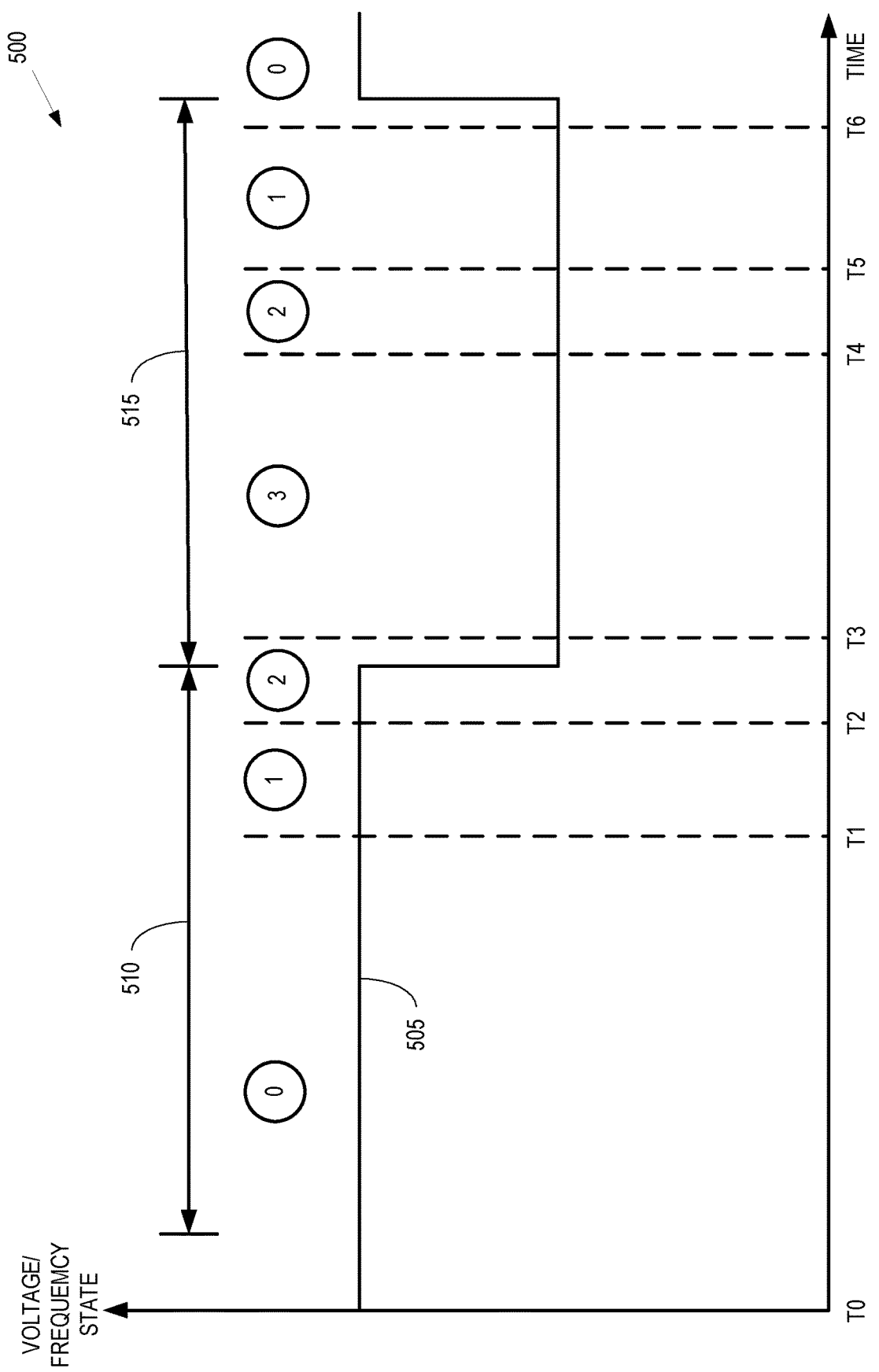
FIG. 5 is a plot of a voltage/frequency state of a compute unit island that is evaluated at predetermined time intervals according to some embodiments.

FIG. 5 is a plot 500 of a voltage/frequency state of an island that is evaluated at predetermined time intervals according to some embodiments. The times T0, T1, T2, T3, T4, T5, and T6 refer to the corresponding times shown in FIG. 3. Thus, the number of active memory barriers in the island corresponds to the number determined by the DVFS hardware while monitoring the wavefronts 301-303 shown in FIG. 3. In the illustrated embodiment, the voltage/frequency state indicates an operating voltage supplied to the island, a clock frequency supplied to the island, or a combination thereof. Larger values of the voltage/frequency state indicate higher operating voltages, higher clock frequencies, or a combination thereof.

The line 505 indicates the voltage/frequency state of the island as a function of time. In the illustrated embodiment, the DVFS hardware evaluates the number of active memory barriers periodically at predetermined time intervals 510, 515. For example, the DVFS hardware determines that there are 2 active memory barriers at the end of the predetermined time interval 510 and 0 active memory barriers at the end of the predetermined time interval 515. The DVFS hardware then determines whether to modify the voltage/frequency state of the island by comparing numbers of active memory barriers at the beginning and at the end of the predetermined time interval 510, 515. For example, there are no active memory barriers at the beginning of the predetermined time interval 510 and the number increases to 2 active memory barriers at the end of the predetermined time interval 510. The DVFS hardware therefore reduces the voltage/frequency state in response to the increase in the number of active memory barriers. For another example, there are 2 active memory barriers at the beginning of the predetermined time interval 515 and the number decreases to know active memory barriers at the end of the predetermined time interval 515. The DVFS hardware therefore increases the voltage/frequency state in response to the decrease in the number of active memory barriers.

Figure 6:
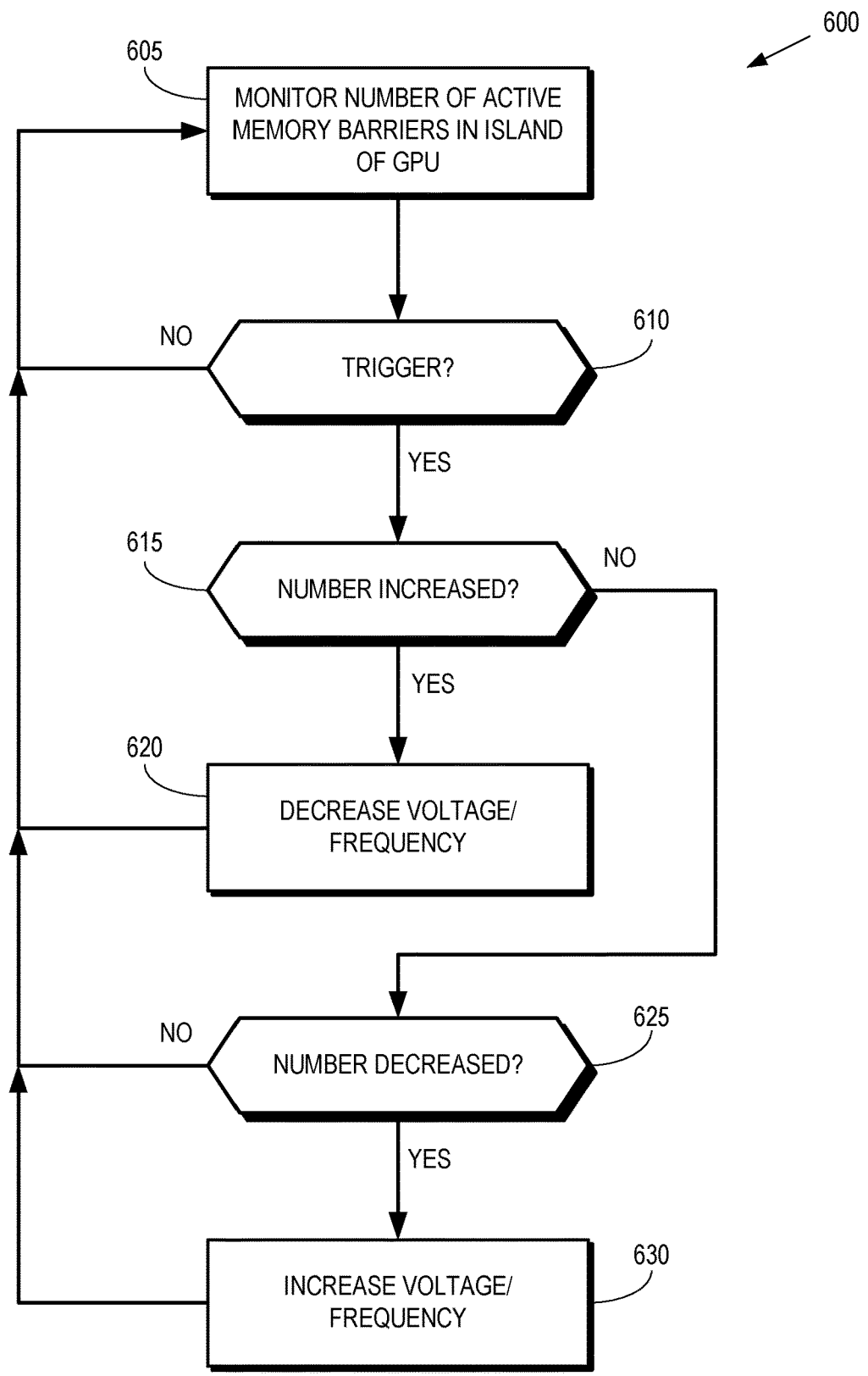
FIG. 6 is a flow diagram of a method of modifying an operating voltage or clock frequency based on a number of active memory barriers in a compute unit island of a processing unit according to some embodiments.

FIG. 6 is a flow diagram of a method 600 of modifying an operating voltage or clock frequency based on a number of active memory barriers in an island of a processing unit according to some embodiments. The method 600 is implemented in some embodiments of the DVFS hardware 150 shown in FIG. 1 and the DVFS hardware 265 shown in FIG. 2.

At block 605, the DVFS hardware monitors a number of active memory barriers in an island of a processing unit such as a GPU. At decision block 610, the DVFS hardware determines whether a trigger for evaluating a number of active memory barriers for a potential modification of the voltage/frequency state of the island is detected. The trigger is a change in the number of active memory barriers, an end of a predetermined monitoring time interval, combinations thereof, or other event. If a trigger is detected, the method 600 flows to decision block 615. If no trigger is detected, the method flows back to block 605 and the DVFS hardware continues monitoring the number of active memory barriers in the island.

At decision block 615, the DVFS hardware determines whether the number of active memory barriers in the island has increased. If so, the method 600 flows to block 620 and the DVFS hardware decreases the operating voltage, clock frequency, or combination thereof that is provided to the island. If the number of active memory barriers in the island did not increase, the method 600 flows to decision block 625.

At decision block 625, the DVFS hardware determines whether the number of active memory barriers in the island has decreased. If not, an eventuality that can occur if the trigger for evaluating the number of active memory barriers is expiration of a predetermined time interval (or other event) but the number of active memory barriers has not changed since the beginning of the predetermined time interval, the method 600 flows back to block 605 and the DVFS hardware continues monitoring the number of active memory barriers. If the number of active memory barriers in the island has decreased, the method 600 flows to block 630 and the DVFS hardware increases the operating voltage, the clock frequency, or a combination thereof that is provided to the island. The method 600 then flows back to block 605 and the DVFS hardware continues monitoring the number of active memory barriers.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A processing unit comprising:
    compute units partitioned into at least one island that is provided with at least one operating voltage and a clock signal having at least one clock frequency independent of providing operating voltages or clock signals to other islands of compute units; and
    dynamic voltage and frequency scaling (DVFS) hardware configured to compute at least one number of active memory barriers in the at least one island and modify the at least one operating voltage or the at least one clock frequency provided to the at least one island in response to a change in the at least one number of active memory barriers in the at least one island.

2. The processing unit of claim 1, wherein the compute units are partitioned into a plurality of islands that are independently provided with operating voltages and clock signal having clock frequencies, and wherein the DVFS hardware is configured to compute numbers of active memory barriers in the plurality of islands.

3. The processing unit of claim 2, wherein the DVFS hardware is configured to modify at least one of a first operating voltage and a first clock frequency of a first clock signal provided to a first island in the plurality of islands in response to a change in a first number of active memory barriers in the first island.

4. The processing unit of claim 3, wherein the DVFS hardware is configured to modify the at least one of the first operating voltage and the first clock frequency independent of operating voltages and clock frequencies of clock signals supplied to other islands in the plurality of islands.

5. The processing unit of claim 3, wherein the DVFS hardware is configured to increase the at least one of the first operating voltage and the first clock frequency in response to a decrease in the first number of active memory barriers in the first island.

6. The processing unit of claim 3, wherein the DVFS hardware is configured to decrease the at least one of the first operating voltage and the first clock frequency in response to an increase in the first number of active memory barriers in the first island.

7. The processing unit of claim 3, wherein the DVFS hardware is configured to modify the at least one of the first operating voltage and the first clock frequency in response to a change in the first number of active memory barriers from a first range of numbers of active memory barriers to a second range of numbers of active memory barriers.

8. The processing unit of claim 3, wherein the DVFS hardware is configured to evaluate the number of active memory barriers at an end of a predetermined time interval and to modify the at least one of the first operating voltage and the first clock frequency in response to a change in the number of active memory barriers between a beginning and an end of the predetermined time interval.

9. The processing unit of claim 8, wherein the predetermined time interval is a minimum time interval determined based on a comparison of an overhead required to modify the at least one of the first operating voltage in the first clock frequency and a potential power savings or performance gain produced by the modification.

10. A method comprising:
    computing at least one number of active memory barriers in at least one island comprising at least one compute unit of a plurality of compute units, wherein the at least one island is provided with at least one operating voltage and at least one clock signal having at least one clock frequency independent of providing operating voltages or clock signals to other islands of compute units; and
    modifying the at least one operating voltage or the at least one clock frequency provided to the at least one island in response to a change in the at least one number of active memory barriers in the at least one island.

11. The method of claim 10, wherein computing the at least one number of active memory barriers comprises computing numbers of active memory barriers in a plurality of islands that include mutually exclusive subsets of the plurality of compute units, and wherein the plurality of islands that are independently provided with operating voltages and clock frequencies.

12. The method of claim 11, wherein modifying the at least one operating voltage or the at least one clock frequency comprises modifying at least one of a first operating voltage and a first clock frequency provided to a first island in the plurality of islands in response to a change in a first number of active memory barriers in the first island.

13. The method of claim 12, wherein modifying the at least one operating voltage or the at least one clock frequency comprises modifying the at least one of the first operating voltage and the first clock frequency independent of operating voltages and clock frequencies of clock signals supplied to other islands in the plurality of islands.

14. The method of claim 12, wherein modifying the at least one operating voltage or the at least one clock frequency comprises increasing the at least one of the first operating voltage and the first clock frequency in response to a decrease in the first number of active memory barriers in the first island.

15. The method of claim 12, wherein modifying the at least one operating voltage or the at least one clock frequency comprises decreasing the at least one of the first operating voltage and the first clock frequency in response to an increase in the first number of active memory barriers in the first island.

16. The method of claim 12, wherein modifying the at least one operating voltage or the at least one clock frequency comprises modifying the at least one of the first operating voltage and the first clock frequency in response to a change in the first number of active memory barriers from a first range of numbers of active memory barriers to a second range of numbers of active memory barriers.

17. The method of claim 12, wherein modifying the at least one operating voltage or the at least one clock frequency comprises evaluating the number of active memory barriers at an end of a predetermined time interval and modifying the at least one of the first operating voltage and the first clock frequency in response to a change in the number of active memory barriers between a beginning and an end of the predetermined time interval.

18. The method of claim 17, wherein the predetermined time interval is a minimum time interval determined based on a comparison of an overhead required to modify the at least one of the first operating voltage in the first clock frequency and a potential power savings or performance gain produced by the modification.

19. A processing unit comprising:
compute units partitioned into islands that are provided with operating voltages and clock signals having clock frequencies independent of providing operating voltages or clock signals to other islands of compute units, wherein the compute units concurrently execute wavefronts; and
dynamic voltage and frequency scaling (DVFS) hardware configured to modify the operating voltages or the clock frequencies provided to the islands in response to changes in numbers of wavefronts in the islands that are waiting for memory access requests to complete.

20. The processing unit of claim 19, wherein the DVFS hardware is configured to modify a first operating voltage or a first clock frequency provided to a first island in the islands in response to a change in a first number of wavefronts in the first island that are waiting for memory access requests to complete, where in the first operating voltage of the first clock frequency are modified independently of operating voltages or clock frequencies provided to other islands.

* * * * *